United States Patent [19]

Saika et al.

[11] Patent Number: 4,939,592
[45] Date of Patent: Jul. 3, 1990

[54] CONTACT PHOTOELECTRIC CONVERSION DEVICE

[75] Inventors: Toshihiro Saika; Noriyuki Kaifu, both of Hiratsuka, Japan

[73] Assignee: Canon Kabushiki Kaisha, Tokyo, Japan

[21] Appl. No.: 205,893

[22] Filed: Jun. 13, 1988

[30] Foreign Application Priority Data

Jun. 12, 1987 [JP] Japan .................. 62-146373

[51] Int. Cl.$^5$ .............................................. H04N 1/04
[52] U.S. Cl. ................................ 358/482; 358/213.19; 250/208.1; 357/65
[58] Field of Search ................. 358/294, 293, 213.11, 358/213.19, 482, 471, 483; 250/578

[56] References Cited

U.S. PATENT DOCUMENTS

| | | | |
|---|---|---|---|
| 3,811,076 | 5/1974 | Smith, Jr. | 307/238 |
| 3,840,391 | 10/1974 | Spitz et al. | 117/106 R |
| 3,841,926 | 10/1974 | Garnache et al. | 148/188 |
| 4,035,829 | 7/1977 | Ipri et al. | 357/49 |
| 4,474,457 | 10/1984 | Phelps | 361/214 |
| 4,480,009 | 10/1984 | Berger | 428/447 |
| 4,549,223 | 10/1985 | Ozawa | 358/294 |
| 4,607,168 | 8/1986 | Oritsuki et al. | 250/578 |
| 4,609,935 | 9/1986 | Kondo | 357/51 |
| 4,650,984 | 3/1987 | Furushima | 250/211 R |
| 4,679,089 | 7/1987 | Kato | 358/213.19 |
| 4,740,710 | 4/1988 | Arita | 250/578 |
| 4,743,750 | 5/1988 | Komatsu et al. | 250/211 R |
| 4,746,989 | 5/1988 | Cannella et al. | 358/213.11 |
| 4,754,152 | 6/1988 | Hayama et al. | 250/578 |

FOREIGN PATENT DOCUMENTS

| | | |
|---|---|---|
| 0079775 | 5/1983 | European Pat. Off. . |
| 3500645 | 7/1985 | Fed. Rep. of Germany . |
| 3612814 | 10/1986 | Fed. Rep. of Germany . |
| 58-17784 | 2/1983 | Japan . |
| 60-178663 | 9/1985 | Japan . |
| 61-32571 | 2/1986 | Japan . |
| 61-189065 | 8/1986 | Japan . |

OTHER PUBLICATIONS

*IBM Technical Disclosure Bulletin*, vol. 21, No. 12, p. 4827, May 1979, Cavaliere, J. et al., "Reduction of Capacitive Coupling Between Adjacent Dielectrically Supported Conductors".

M. Labeau, et al., "Depot de Couches Minces D'Oxydes Par Pyrolyse d'un Aéorosol, L'Oxyde Transparent Conducteur CdIn$_2$O$_4$", undated (in French).

*Journal of Vacuum Science & Technology*, vol. 14, No. 5, pp. 1082–1099, Sep./Oct. 1977, Kern, W. et al., "Advances in Deposition Processes for Passivation Films".

*Primary Examiner*—Edward L. Coles, Sr.
*Attorney, Agent, or Firm*—Fitzpatrick, Cella, Harper & Scinto

[57] ABSTRACT

A photoelectric conversion device has photoelectric conversion element of N×M arranged in a one-dimensional array on a substrate and connected to common lines of a number M in a matrix wiring, and also having a transparent protective layer on the photoelectric conversion elements and common lines of the matrix wiring, comprising wirings maintained at a constant potential at least at the outside of one of the array of the common lines of the matrix wiring.

10 Claims, 4 Drawing Sheets

CONTACT PHOTOELECTRIC CONVERSION DEVICE

BACKGROUND OF THE INVENTION

1. Field of the Invention

The present invention relates to a photoelectric conversion device, and more particularly to a photoelectric conversion device equipped for example with a one-dimensional line sensor for reading image information of an original document maintained in contact therewith and moved relative thereto, and adapted for use in facsimile apparatus, image reader, digital copying machine, electronic blackboard or the like.

2. Related Background Art

FIG. 1 is a cross-sectional view, along the sub scanning direction, of a conventional contact photoelectric conversion device utilizing a linear sensor.

FIG. 2 illustrates common lines of the matrix wiring in the conventional photoelectric conversion device shown in FIG. 1, and capacitances between the lines.

A light shielding layer 2 having an aperture for illumination 3 and individual electrodes 4 of matrix are formed on a translucent insulating substrate 1, and a translucent insulating layer 5 is formed for insulating photoelectric conversion elements 6 from the light shielding layer 2. On said layer there are formed photoelectric conversion layers 16, for example of amorphous silicon (a-Si), of photoelectric conversion elements 6 arranged by a number of N×M in the main scanning direction. The photoelectric conversion elements 6 are respectively connected to common lines 7 of a number M of a matrix wiring, through contact holes 17, 18. A thin glass plate such as microsheet glass may be adhered thereon as a transparent protective layer 8, and a hard thin film for example of $Al_2O_3$, SiC or $Si_3N_4$ may be formed on the transparent protective layer 8. The light entering from the aperture 8 is reflected by the original 10 advanced by a roller 9, and the intensity of the reflected light is converted into electrical signals by the photoelectric conversion elements 6.

However such contact photoelectric conversion device has been associated with a drawback of generating noises in the signal output circuit due to the electrostatic charge generated by the friction between the original document and the transparent protective layer composed of thin glass plate or the hard insulating film formed thereon, which are both highly insulating.

In particular, as shown in FIG. 2, the common lines of matrix wiring run over the entire length of the photoelectric conversion device in the main scanning direction and are easily subject to the influence of electrostatic charges. Among the parallel common lines, as shown in FIG. 2, outer ones show less capacitive coupling with other lines than inner ones, and are more easily influenced by external noises such as electrostatic charges. FIG. 2 illustrates only the capacitances with two closest lines on either side. A line M2 has capacitive coupling with four lines M, M1, M3 and M4, but the line M has coupling with only two lines M1 and M2. Consequently, as shown in FIG. 3(b), the signals of outer lines tend to receive stronger influences.

SUMMARY OF THE INVENTION

The object of the present invention is to provide a contact photoelectric conversion device free from the above-mentioned drawbacks and capable of easily reducing the electrostatically induced noises in uniform manner with a simple structure.

The above-mentioned object can be achieved according to the present invention by a photoelectric conversion device having photoelectric conversion elements of a number N×M arranged in a one-dimensional array and connected to matrix common lines of a number M and also having a transparent protective layer, for direct contact with an original image, on said photoelectric conversion elements and matrix common lines, comprising wirings capable of maintaining a constant potential at least at the outside of said matrix common lines, thereby bringing the capacitive coupling of the outer ones of the matrix common lines with other lines substantially equal to that of the inner ones, thus uniformly reducing the electrostatically induced noises.

DETAILED DESCRIPTION OF THE PREFERRED EMBODIMENTS

Figure 4A:
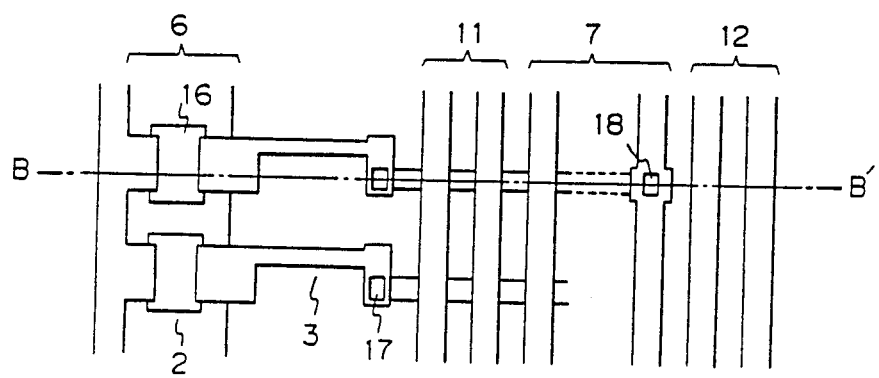
FIG. 4(A) is a plan view of a first embodiment of the present invention.
Figure 4B:
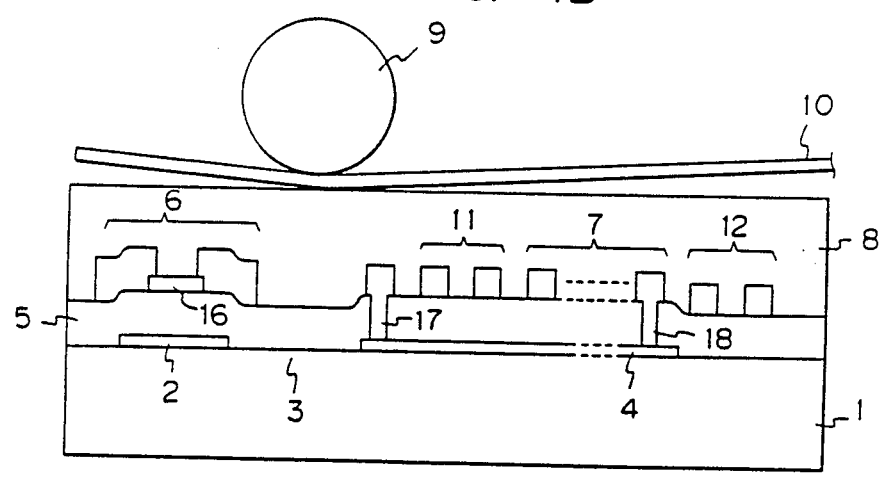
FIG. 4(B) is a cross-sectional view along a line B—B' in FIG. 4(A)
Figure 5:
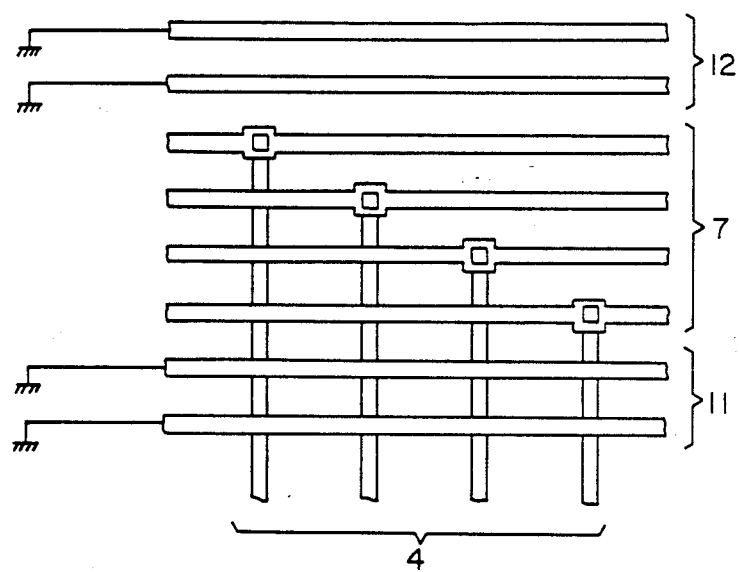
FIG. 5 is a view of common lines of the matrix wiring of the embodiment shown in FIG. 4.

FIGS. 4 and 5 illustrate the feature of the first embodiment of the present invention, wherein FIG. 4(A) is a plan view of the contact photoelectric conversion device of the present invention, while FIG. 4(B) is a cross-sectional view along a line B—B' in FIG. 4(A). As shown in these drawings, on a translucent insulating substrate 1, there are formed a light shielding layer 2 composed for example of Al, Cr, Ta or Ti and having an illuminating window 3, and individual electrodes 4 of the matrix wiring. In addition a translucent insulating layer 5 composed for example of $SiO_2$ or $Si_3N_4$, is formed by sputtering, in order to insulate photoelectric conversion elements 6 from the light shielding layer 2. On said layer and in the vicinity of the aperture for illumination 3, photoelectric conversion layers 16 are formed for example with amorphous silicon to constitute photoelectric conversion elements 6 of a number N×M arranged along the main scanning direction. Said photoelectric conversion elements 6 are respectively connected, through contact holes 17, 18 and individual electrodes 4, to common lines 7 of a number M formed for example with Al, Ta or Ti. On both sides of the common lines 7 there are provided wirings 11, 12 comprising Al, Ta, Ti or the like for maintaining each of potential constant. The wirings 11, 12 have the same configuration as that of the matrix common wiring 7 and are formed simultaneously with the common lines 7 of the matrix wiring.

On the above-explained structure, a transparent protective layer 8 comprising a thin glass plate such as microsheet glass is provided by adhesion. Thus the light entering from the aperture 3 is reflected by an original document 10 advanced by a roller 9, and the intensity of the reflected light is converted into electrical signals by the photoelectric conversion elements 6.

Figure 6:
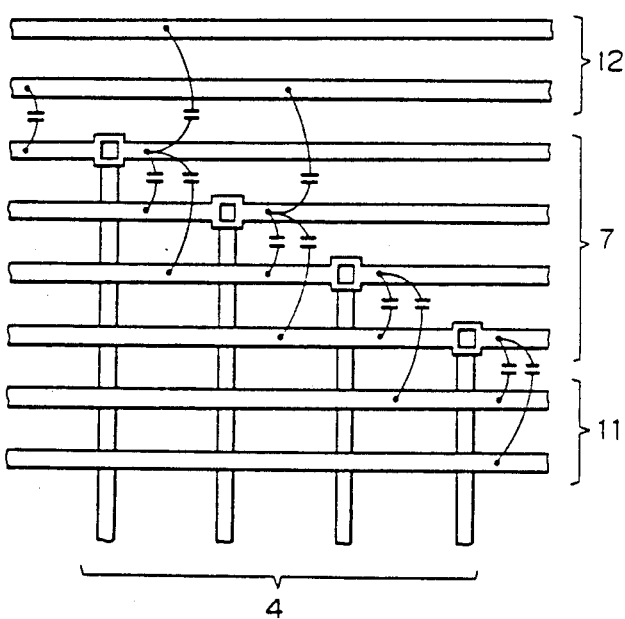
FIG. 6 is a view showing capacitances between common lines of the matrix wiring shown in FIG. 5.

FIG. 5 is a plan view of the common lines of the matrix wiring in the contact photoelectric conversion device of the present invention shown in FIG. 4, wherein shown in a case M=4. FIG. 6 shows illustratively the capacitances among the common lines of the matrix wiring.

In FIG. 5 there are shown individual electrodes 4 of the matrix wiring; common lines 7 thereof; and wirings 11, 12 of the present invention for maintaining a constant potential.

Figure 1:
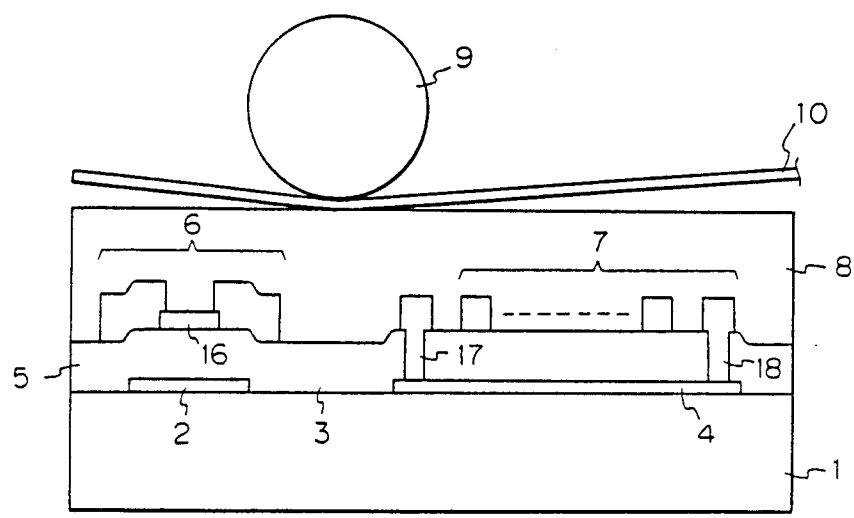
FIG. 1 is a cross-sectional view of a conventional contact photoelectric conversion device.
Figure 2:
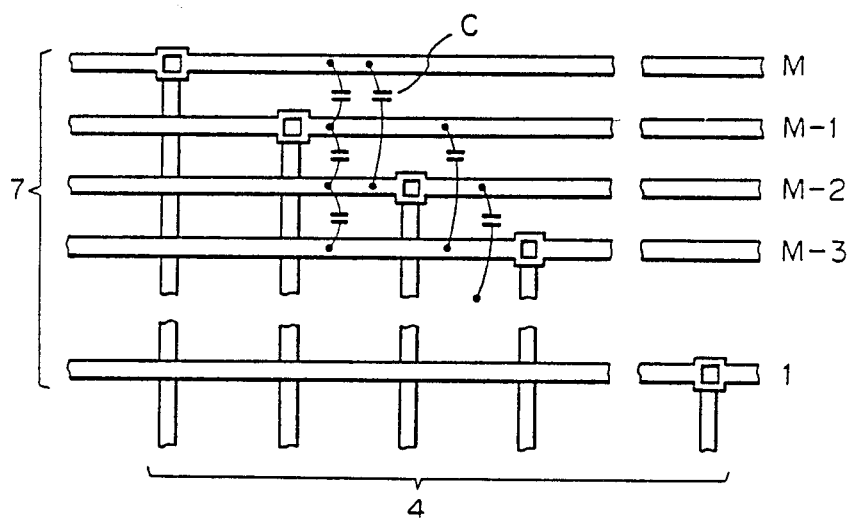
FIG. 2 is a schematic view of common lines of matrix wiring in the conventional contact photoelectric conversion device.
Figure 3A:
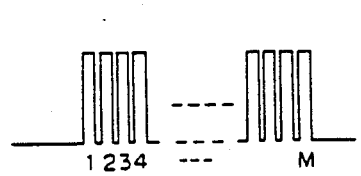
FIG. 3(a) is a chart showing normal output distribution of the conventional contact photoelectric conversion device.
Figure 8:
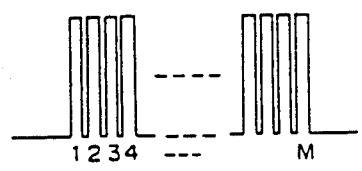
FIG. 8 is a chart showing the output distribution of the contact photoelectric conversion device of the present invention under electrostatic induction.
Figure 3B:
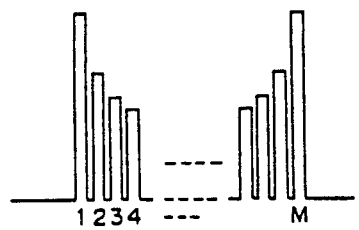
FIG. 3(b) is a chart showing the output distribution of said conversion device under electrostatic induction.

The presence of the wirings 11, 12 of a constant potential outside the common lines 7 realizes a substantially same capacitative coupling for all line, so that the noises induced in the common lines 7 by the electrostatic charge generated by the friction between the original 10 and the transparent protective layer 8 can be almost uniformly reduced as shown in FIG. 8. It is therefore possible to obtain uniform output signals.

Figure 7:
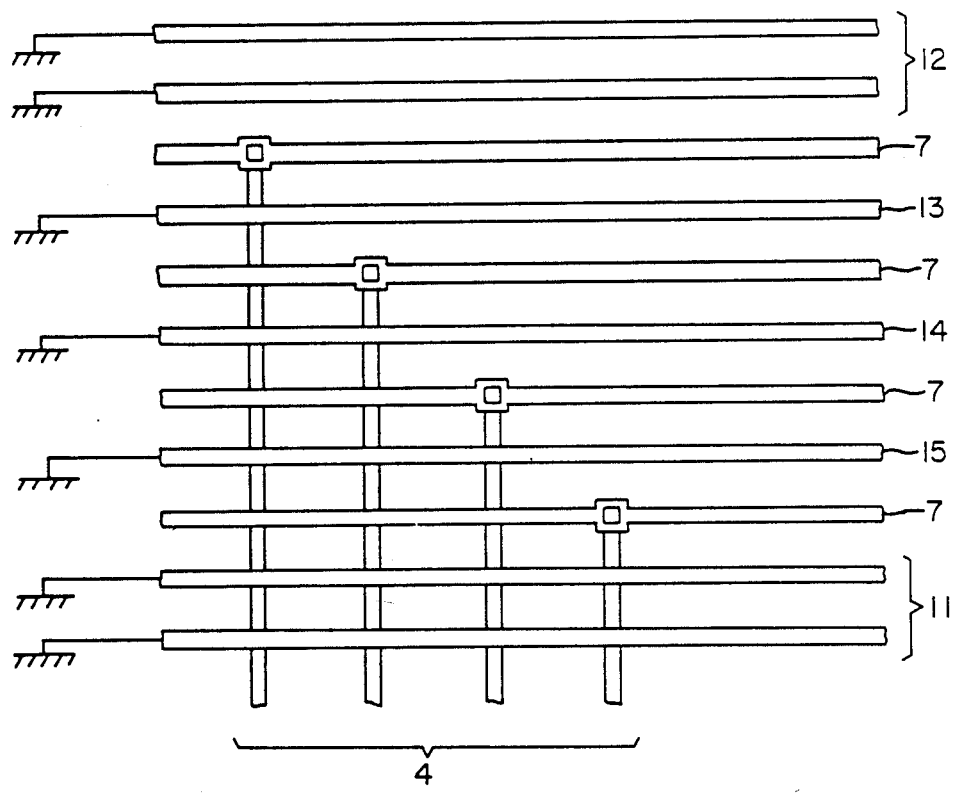
FIG. 7 is a view of a second embodiment of the present invention.

FIG. 7 shows a second embodiment of the present invention.

FIG. 7 is a plan view of matrix wiring of the contact photoelectric conversion device, wherein grounding wirings 13–15 among the respective common lines are added. As in the foregoing embodiment, such structure realizes a substantially same capacitative coupling for any of the common lines, thereby uniformly reducing the electrostatically induced noises. Besides, since each common line is electrically shielded, capacitative couplings among respective matrix common lines resulting from a parallel arrangement of the matrix common lines is eliminated. Accordingly, no crosstalk is caused. S/N ratio is enhanced.

The wirings 11–15 for maintaining a constant potential should have a width equal to or larger than that of the common line, preferably comparable to the thickness of the transparent protective layer. Preferably plural wirings are provided if the width hereof is comparable to that of the common lines.

In the foregoing embodiments the photoelectric conversion elements are directly connected to the common lines by means of individual electrodes, but the present invention is applicable to in a structure in which the photoelectric conversion elements and the common lines of the matrix wiring are connected through driving circuits composed for example of thin film transistors. And similar advantage was obtained.

As explained in the foregoing, these embodiments enable to uniformly reduce the electrostatically induced noises by a very simple structure of forming wirings for maintaining a constant potential, outsde the common lines of the matrix wiring, thereby providing a compact photoelectric conversion device. In particular, the present invention is advantageous in a type of the device for reading image information which contacts the original.

What is claimed is:

1. A photoelectric conversion device comprising:
    a substrate;
    M common lines, M being a predetermined positive integer;
    a matrix N×M of photoelectric conversion elements arranged in an array disposed on said substrate and connected to said M common lines forming a matrix wiring, wherein N is a predetermined positive integer;
    a transparent protective layer disposed on said photoelectric conversion elements and said M common lines of the matrix wiring; and
    grounding wirings maintained at a ground potential disposed at least on both sides of said M common lines of the matrix wiring.

2. A device according to claim 1, wherein said grounding wirings are also provided between respective common lines of the matrix wiring.

3. A device according to claim 2, wherein said grounding wirings have the same width as a thickness of said transparent protective layer.

4. A device according to claim 1, wherein said grounding wirings have the same configuration as that of said common lines.

5. A device according to claim 1, wherein said grounding wirings comprise a material selected from the group consisting of Al, Ta, and Ti.

6. A device according to claim 1, wherein said photoelectric conversion elements have a photoelectric conversion layer comprising amorphous silicon.

7. A device according to claim 1, wherein said device contacts an original to read image information.

8. An apparatus comprising a photoelectric conversion device, wherein said device comprises: a substrate, M common lines, M being a predetermined positive integer, a matrix N×M of photoelectric conversion elements arranged in an array disposed on said substrate and connected to said M common lines forming a matrix wiring, wherein N is a predetermined positive integer, a transparent protective layer disposed on said photoelectric conversion elements and said M common lines of the matrix wiring, grounding wirings maintained at a ground potential and disposed at least on both sides of said M common lines of the matrix wiring, and means for maintaining said grounding wirings at said ground potential.

9. An apparatus according to claim 8, wherein said apparatus further comprises means for advancing an original document relative to said photoelectric conversion device.

10. An apparatus according to claim 9, wherein said advancing means includes a roller.

* * * * *